United States Patent [19]

Barbee et al.

[11] Patent Number: 5,728,222
[45] Date of Patent: *Mar. 17, 1998

[54] APPARATUS FOR CHEMICAL VAPOR DEPOSITION OF ALUMINUM OXIDE

[75] Inventors: Steven George Barbee, Dutchess County; Richard Anthony Conti, Westchester County; Alexander Kostenko; Narayana V. Sarma, both of Dutchess County; Donald Leslie Wilson, Orange County, all of N.Y.; Justin Wai-Chow Wong, Chittenden County, Vt.; Steven Paul Zuhoski, Dallas County, Tex.

[73] Assignee: International Business Machines Corporation, Armonk, N.Y.

[*] Notice: The term of this patent shall not extend beyond the expiration date of Pat. No. 5,505,664.

[21] Appl. No.: 541,278

[22] Filed: Oct. 12, 1995

Related U.S. Application Data

[62] Division of Ser. No. 316,303, Sep. 19, 1994.

[51] Int. Cl.$^6$ ...................................... B05C 11/00
[52] U.S. Cl. ......................... 118/715; 118/723 MD; 118/723 IR
[58] Field of Search ..................... 118/715, 719, 118/723 MP, 423 IR, 725

[56] References Cited

U.S. PATENT DOCUMENTS

| | | | |
|---|---|---|---|
| 4,696,833 | 9/1987 | Monnig et al. | 437/225 |
| 4,844,006 | 7/1989 | Page, Jr. et al. | 118/719 |
| 4,847,469 | 7/1989 | Hofmann et al. | 392/397 |
| 5,020,475 | 6/1991 | Crabb et al. | 118/719 |
| 5,038,711 | 8/1991 | Dan et al. | 118/715 |
| 5,060,354 | 10/1991 | Chizinsky | 29/25.02 |
| 5,121,705 | 6/1992 | Sugino | 118/719 |
| 5,156,461 | 10/1992 | Moslehi et al. | 374/121 |

(List continued on next page.)

OTHER PUBLICATIONS

Vossen, et al., "Thin Film Processes", Academic Press, pp. 290–325.
Keonjian, "Microelectronics, Theory, Design and Fabrication", pp. 191–193 and p. 256.
Vacuum General Precision Instrumentation, Product Spec for "Low Vapor Pressure Delivery System", pp. 2–10.
Ferran, "Delivering Low-Vapor Pressure Materials to LPCVD Processes", Microelectronic Manufacturing & Testing, Sep. 1988, pp. 26–29.
Aboaf, "Deposition and Properties of Aluminum Oxide Obtained by Pyrolytic Decomposition of an Aluminum Alkoxide", 1967, pp. 948–952.

*Primary Examiner*—Felisa Garrett
*Attorney, Agent, or Firm*—Whitham, Curtis, Whitham & McGinn; Alison Mortinger, Esq.

[57] ABSTRACT

An apparatus in a chemical vapor deposition (CVD) system monitors the actual wafer/substrate temperature during the deposition process. The apparatus makes possible the production of high quality aluminum oxide films with real-time wafer/substrate control. An infrared (IR) temperature monitoring device is used to control the actual wafer temperature to the process temperature setpoint. This eliminates all atmospheric temperature probing. The need for test runs and monitor wafers as well as the resources required to perform the operations is eliminated and operating cost are reduced. High quality, uniform films of aluminum oxide can be deposited on a silicon substrates with no need for additional photolithographic steps to simulate conformality that are present in a sputtered (PVD) type application. The result is a reduction in required process steps with subsequent anticipated savings in equipment, cycle time, chemicals, reduce handling, and increased yield of devices on the substrate. The apparatus incorporates a heated source material, heated delivery lines, heated inert gas purge lines, a pressure differential mass flow controller, a control system with related valving, and a vacuum process chamber with walls that are temperature controlled as a complete source delivery system to accurately and repeatably provide source vapor for LPCVD deposition of aluminum oxide onto silicon substrates.

10 Claims, 4 Drawing Sheets

U.S. PATENT DOCUMENTS

| | | | |
|---|---|---|---|
| 5,160,542 | 11/1992 | Mihira et al. | 118/715 |
| 5,160,543 | 11/1992 | Ishihara et al. | 118/715 |
| 5,186,120 | 2/1993 | Ohnishi et al. | 118/667 |
| 5,208,643 | 5/1993 | Fair | 356/43 |
| 5,209,182 | 5/1993 | Ohta et al. | 118/666 |
| 5,209,952 | 5/1993 | Erdmann et al. | 427/255.6 |
| 5,232,509 | 8/1993 | Min et al. | 118/723 R |
| 5,273,588 | 12/1993 | Foster et al. | 118/723 E |
| 5,290,604 | 3/1994 | Nielsen | 118/300 |
| 5,356,476 | 10/1994 | Foster et al. | 118/725 |
| 5,431,734 | 7/1995 | Chapple-Sokol et al. | 118/712 |

APPARATUS FOR CHEMICAL VAPOR DEPOSITION OF ALUMINUM OXIDE

CROSS REFERENCE TO RELATED APPLICATION

This application is a divisional of application Ser. No. 08/316,303 filed Sep. 30, 1994 now allowed.

Field of the Invention

The present invention generally relates to the chemical vapor deposition (CVD) of dense thin aluminum oxide ($Al_2O_3$) films on silicon substrates in the manufacture of semiconductor devices and, more particularly, to an improved method and apparatus for the low pressure chemical vapor deposition (LPCVD) of aluminum oxide films using aluminum tri-isopropoxide ($Al(OC_3H_7)$), known in the art as ATI, as a precursor to aluminum oxide in a high volume manufacturing environment.

BACKGROUND OF THE INVENTION

The utility of CVD $Al_2O_3$ as a reactive ion etch (RIE) stop layer (during tungsten contact stud patterning) has been clearly demonstrated. For this application, a dense aluminum oxide film is defined as having the following characteristics:

Index of refraction: 1.59–1.62

Etch rate (3.6% phosphoric acid at 75° C.): <25 nm/min

Hydroxyl content (OH, by infrared (IR) spectroscopy, absorbance per micron of film thickness at 3500 $cm^{-1}$): <0.005

Shrinkage of film thickness upon annealing (30 min. at 500° C.): <1.5%

The literature indicates that aluminum tri-isopropoxide (Al($OC_3H_7$)), known in the art as ATI, is a viable sub-500° C. $Al_2O_3$ precursor. See, for example, J. A. Aboaf, *J. Electrochem. Soc.*, 114, 948 (1967), J. Fournier et al., *Mat. Res. Bull.*, 23, 31 (1988), J. Kwon, J. Saraie and Y. Yodogawa, *J. Electrochem Soc.*, 132, 890 (1985), H. Mutoh et al., *J. Electrochem. Soc.*, 122, 987 (1975), and R. W. J. Morssinkhof et al., "Mechanistic Aspects of the Deposition of Thin Alumina Films Deposited by MOCVD", paper presented at Spring Meeting of the Materials Research Society, San Francisco, Calif. (1990). In these references, ATI is utilized under conditions in which 1) only bubbling is used to deliver ATI to the reactor, 2) a variety of ATI operating temperatures (78–170° C.) is practiced, 3) deposition repeatability is not demonstrated, and 4) only a single substrate requires coating. However, while the literature describes the use of ATI for $Al_2O_3$ deposition, the literature describes bubbling techniques using an ATI carrier but fails to present a workable manufacturing process. In fact, the bubbling technique described in the literature will not work in a manufacturing environment.

During the aluminum oxide low pressure chemical vapor deposition (LPCVD) process, substrate temperature is critical to the deposition of a high quality aluminum oxide film. Low wafer temperature typically yields a film with high etch rates and low density. If the substrate temperature is not controlled from run to run, the etch rate can vary and subsequent etch processes cannot be accurately controlled in a batch process. Using an embedded thermal measurement device such as a resistance thermal device (RTD) or thermocouple within the susceptor or chuck provides no direct measurement of the wafer/substrate temperature, and there is no guarantee that consecutively processed substrates/wafers will achieve the same temperature and thus the films will have different etch rates. Although the substrate/wafer rests on and may be mechanically gripped by the heated susceptor/chuck, the thermal transfer at process pressure between the substrate/wafer and the susceptor/chuck is not predictable and may lead to large differences between the susceptor/chuck temperature and the successive processed wafers/substrates.

There is no current means to insure wafer/substrate temperature during the LPCVD process. Instead, various external means of calibrating the temperature controller are employed. One such technique requires the process chamber to be vented to atmosphere and a thermocouple probe placed against the wafer susceptor/chuck face to measure the face temperature. Adjustments are then made to the susceptor/chuck temperature controller based on the readings from the thermocouple probe. These types of procedures do not take into account chuck face emissivity, radiation heating effects with the system at process pressure, and/or the wafer/substrate emissivity when the wafer/substrate is place on the chuck/susceptor. The obvious result is a series of "test" runs that are used to measure the etch rate on monitor wafers prior to processing of actual product wafers. This becomes extremely costly with respect to the resource time required, the expense of monitor wafers/substrates, the loss of process tool availability of not only the LPCVD system, but also wet etch and inspection/measurement equipment.

A plasma vapor deposition (sputtered) technique may be employed with several photolithography and wet etch steps to simulate the conformal coverage. However, the many steps increases equipment cost, cycle time, chemical, handling, and additional resources.

An improperly designed delivery system for transporting a low pressure reactive vapor from a heated source vessel to a vacuum processing chamber will lead to vapor decomposition or condensation of the vapor. Either of which result in the reactive vapor byproducts depositing within the delivery system causing restrictions and eventual clogging of the delivery system.

Transporting a low pressure reactive vapor from a heated source vessel to a vacuum processing chamber can lead to decomposition or condensation of the vapor material onto the walls of the supply tubing or flow controlling devices. To initiate and maintain a constant flow of a low pressure vapor material, a heated source vessel is used to provide adequate vapor pressure. An unheated delivery system will allow the vapor to condense within the delivery system causing restrictions and eventual clogging of the delivery system. Conversely, if heating in the delivery system is too high, decomposition of the vapor will occur resulting in poor deposited film quality, inferior etch stop quality within the wafer/substrate, and eventual plating out to form blockages within the delivery system.

Stagnant source chemical trapped in the delivery system during idle periods when there is no flow may also decompose and plate out into the delivery system eventually causing flow restriction and ultimately system blockage. Vacuum pumping of the delivery lines themselves has been demonstrated to be ineffective in removing the reactive source vapor and resultant system blockage. An additional problem can also be encountered due to a surface film being formed in the source vessel that limits the vapor generated and starves the process for reactive chemical. Without correctly designed substrate temperature measurement and control, inert gas purging, and agitation of the source chemical, delivery of the vapor to the process chamber is not a reliable or manufacturable process.

SUMMARY OF THE INVENTION

It is therefore an object of the present invention to provide a means to measure the actual wafer/substrate temperature during the chemical vapor deposition of aluminum oxide.

It is another object of this invention to provide a thermally balanced, inert gas purged, and temperature controlled vapor delivery system eliminating delivery system blockages caused by condensation and/or decomposition of reactant vapor within the vapor delivery system.

It is another object of this invention to eliminate poor film quality deposition on the first wafer of a production run.

It is another purpose of this invention to provide a reproducible and manufacturable deposition process that provides a high quality and conformal aluminum oxide film using low pressure chemical vapor deposition (LPCVD) on a silicon substrate or equivalent.

According to the invention, high quality, uniform films of aluminum oxide can be routinely deposited on a silicon substrate with no need for additional photolithographic steps to simulate conformality that are present in a sputtered (PVD) type application. The result is a reduction in required process steps with subsequent anticipated savings in capital equipment, cycle time, chemicals, and human resources.

The invention incorporates into a typical LPCVD reactor, a central temperature controller, an accurate heating system for the source material, an accurately heated source delivery system, an accurately heated inert gas purge system, accurately heated gas dilution gas lines, an accurately heated vacuum foreline, an accurately heated throttle valve, an accurately heated pressure differential based mass flow controller and accurate temperature control of the vacuum chamber wall temperature. The invention also features real time substrate temperature control utilizing IR temperature monitoring and feedback control and a Fourier transform infrared spectrometer (FTIR) vapor analysis system to control reactant vapor flow.

The apparatus used in the practice of the invention incorporates a heated source material, heated delivery lines, heated inert gas purge lines, a pressure differential mass flow controller, a control system with related valving, and a vacuum process chamber having walls that are temperature controlled as a complete source delivery system to accurately and repeatably provide source vapor for LPCVD deposition of aluminum oxide onto silicon substrates.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT AND BEST MODE FOR PRACTICE OF THE INVENTION

Figure 1:
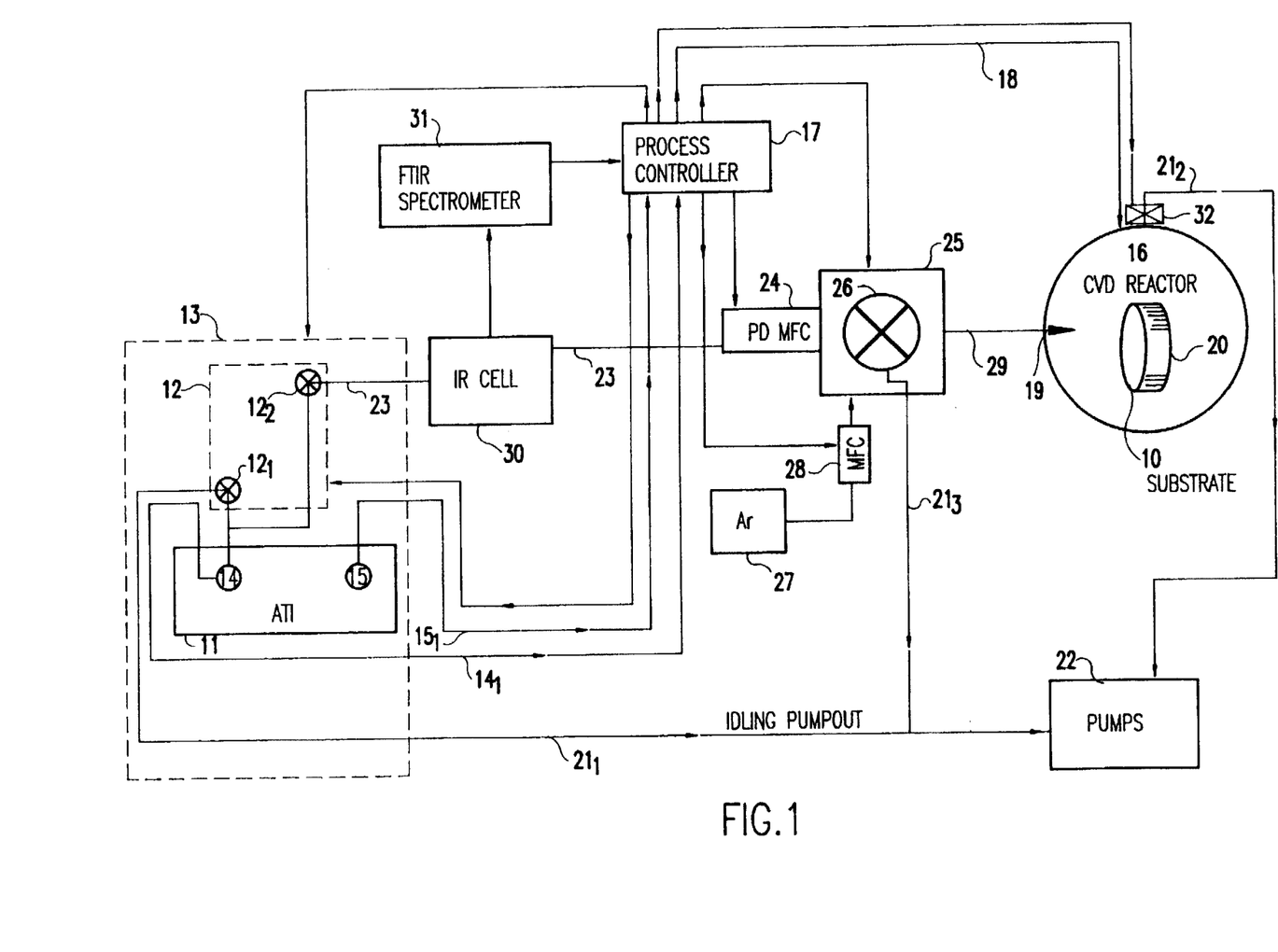
FIG. 1 is a block diagram showing the major components of the apparatus for depositing thin films of aluminum oxide on wafers according to a preferred embodiment of the invention.

Referring now to the drawings, and more particularly to FIG. 1, there is shown an apparatus for depositing aluminum oxide on a substrate according to a preferred embodiment of the invention. A pressure vessel 11 contains aluminum tri-isopropoxide (ATI) source material from which a source chemical vapor is produced. A delivery manifold 12, including a pair of valves $12_1$ and $12_2$, is connected to the pressure vessel 11 and has first and second outputs respectively connected to these two valves. The valves $12_1$ and $12_2$ of the delivery manifold selectively deliver the ATI source chemical vapor to the first or second output. An isothermal oven 13 contains the pressure vessel 11 and the delivery manifold 12 for heating them and maintaining them at an accurate, controlled temperature. Sensors 14 and 15 respectively monitor pressure and temperature within the pressure vessel 11 and communicate this data to the process controller via signal cables $14_1$ and $15_1$, respectively.

A chemical vapor deposition (CVD) process chamber 16 has wall temperature control by the process controller 17, as indicated by control line 18. The CVD process chamber 16 also has at least one gas injector nozzle 19 for injection of gas into the chamber and a heated susceptor or chuck 20 which holds a workpiece 10, such as a silicon wafer substrate, on which aluminum oxide films are to be deposited. Insulated and temperature controlled exhaust lines $21_1$ and $21_2$ are respectively connected to the first output of said delivery manifold 12 and to CVD process chamber 16 for providing a temperature controlled exhaust from the delivery manifold and the CVD process chamber to a vacuum pump 22. A temperature controlled delivery line 23 is connected at the first end thereof to the second output of said delivery manifold 12. The delivery line 23 has a cross section so as not to restrict the mass flow of the ATI source chemical vapor for a desired deposition rate of aluminum oxide on a wafer. A temperature controlled pressure differential mass flow controller (PDMFC) 24 is ultimately connected to the second end of the delivery line 23 and, under the control of process controller 17, provides accurate flow of the ATI source chemical vapor through the delivery line 23.

A premix chamber 25 including a heated and insulated valve premix manifold assembly 26 is connected to the pressure differential mass flow controller 24. The premix manifold assembly 26 has first and second outputs. The first output of said premix manifold assembly 26 comprises a chamber for allowing the ATI source chemical vapor to be mixed with a mass flow controlled, preheated gas, such as argon from source 27. This gas is delivered via mass flow controller (MFC) 28 to the premix manifold assembly 26. The first output of the premix manifold assembly 26 is connected by line 29 to the gas injector nozzle 19 of the CVD process chamber 16 for injection of the mixed ATI source chemical vapor and diluent gas therein. The second output of the premix manifold assembly 26 is connected to the exhaust line $21_3$.

The process controller 17 is a microprocessor based controller and is connected to the delivery manifold 12, the oven 13, the pressure vessel monitoring sensors 14 and 15, the exhaust lines $21_1$, $21_2$, and $21_3$, heated throttle valve, the delivery line 23, the pressure differential mass flow controller 24, the mass flow controller 28, the walls of CVD reactor 16, and the premix manifold assembly 26 for controlling the pressure and the temperature of the ATI source chemical vapor being delivered throughout the system to be substantially constant thereby minimizing potential condensation and/or decomposition of the ATI source chemical vapor during delivery. The process controller 17 further controls the delivery of the ATI source chemical vapor from the pressure vessel 11 to the exhaust lines $21_1$ and $21_3$, the delivery line 23, the premix manifold assembly 26, and the CVD process chamber 16 according to prescribed deposition process parameters.

The delivery line 23 leads to an infrared (IR) cell 30. A Fourier transform infrared (FTIR) spectrometer 31, or other IR sensing device proximate to the IR cell 30, analyzes the full concentration of vapor flowing through the IR cell 30 before it travels to the chemical vapor deposition chamber 16. The FTIR spectrometer 31 sends information to the process controller 17 which controls the valve of the premix manifold assembly 26. The process controller 17 operates the valve of the premix manifold assembly 26 based upon the information it receives from the FTIR spectrometer 31. The delivery line 23 leads from the IR cell 30 through the pressure differential mass flow controller (PDMFC) 24 to the valve of the premix manifold assembly 26. The outputs from this valve are represented by line 29 leading to the CVD process chamber 16 and the exhaust line $21_3$ leading to the system pump 22.

When the reactant vapor flowing in the IR cell 30 is analyzed by the FTIR spectrometer 31, information is given to the process controller 17 indicating whether contaminants or decomposition products are present. A composition of reactant vapor which is substandard for quality $Al_2O_3$ film deposition will cause the process controller 17 to operate the valve of the premix manifold assembly 26 to switch such that the ATI chemical source vapor will proceed through exhaust line $21_3$ to pump 22, rather than through line 29 to the chemical vapor deposition chamber 16. If the composition of the ATI chemical source vapor is appropriate, the valve of the premix manifold assembly 26 will be operated to direct the ATI chemical source vapor through line 29 to nozzle 19 in the CVD process chamber 16 and proceed to react on workpiece 10.

The process controller 17 operates to control the temperature of the ATI in pressure vessel 11 during periods of no production demand at a temperature no less than 90° C. but not greater than 95° C. During periods of no production demand, the ATI is stored under vacuum. The process controller 17 raises the ATI temperature to a temperature no greater than 125 ° C. in preparation for a period of production demand and maintains the ATI during periods of production demand at a temperature not greater than 125° C. The ATI chemical vapor is transported to the CVD process chamber 16 via direct evaporation. To improve delivery of the ATI chemical vapor during periods of production demand, the ATI pressure vessel 11 may be agitated. The ATI chemical vapor is directed to the reactor bypass exhaust line $21_3$ in lieu of nozzle 19 in CVD process chamber 16 during a start up period, and the flow to the bypass exhaust line $21_3$ is maintained until the concentration of ATI chemical vapor in the delivery line 23 to the reactor is greater than a prescribed level, typically greater than 99%, as determined by the FTIR system. The ATI chemical vapor is directed to nozzle 19 in the CVD process chamber 16 through line 29 after the concentration of ATI chemical vapor in the reactor supply line has reached a prescribed level, typically greater than 99%, for deposition of aluminum oxide on the workpiece 10. The temperature of the ATI chemical vapor is again reduced to about 90° C. after termination of the production demand period.

Figure 2:
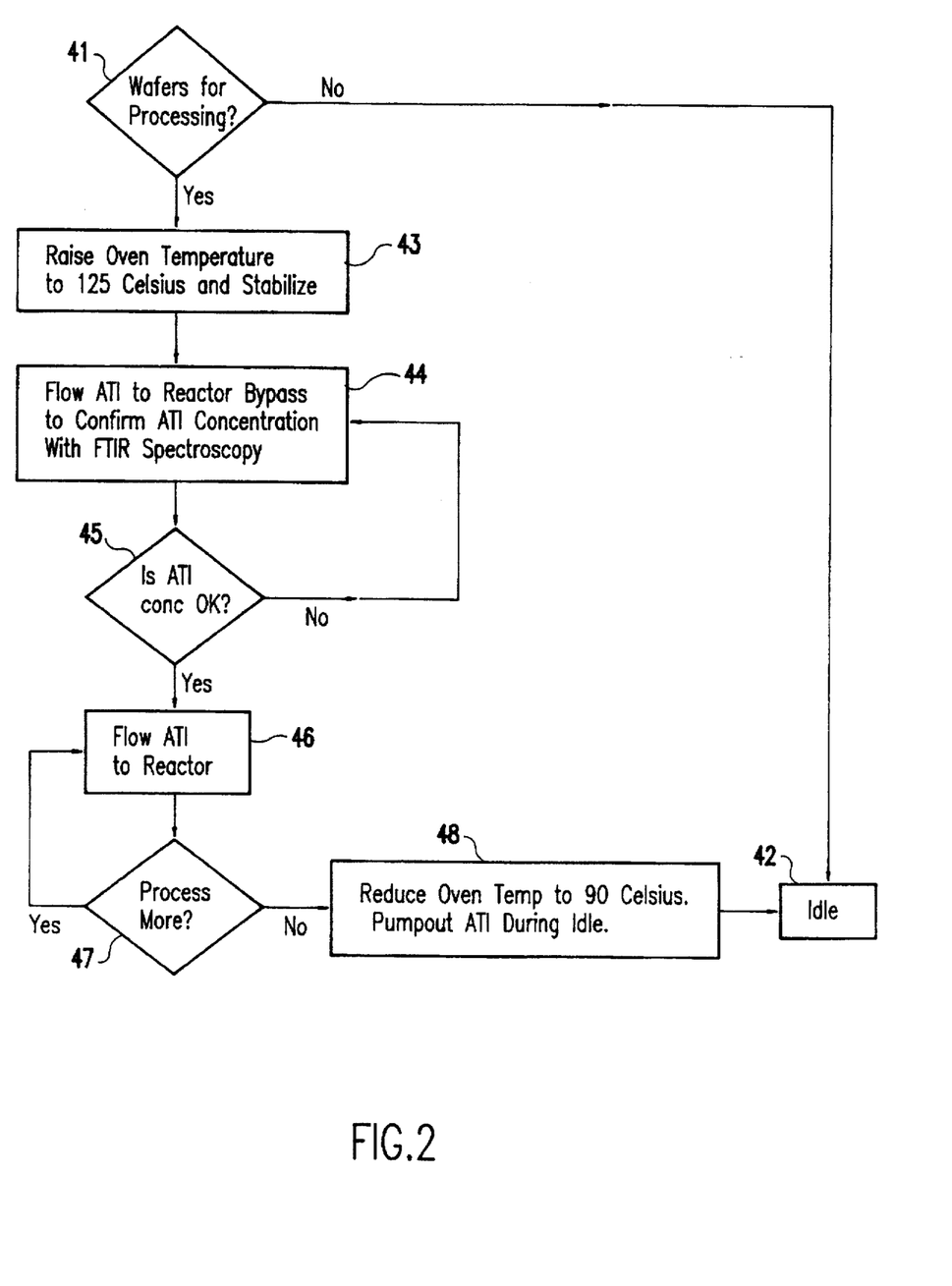
FIG. 2 is a flow diagram showing the control of the apparatus shown in FIG. 1 by the microprocessor controller.

FIG. 2 is a flow diagram showing the process controlled by the microprocessor based process controller 17. On staff up, the process controller 17 determines whether there are wafers ready for processing, as indicated by decision block 41. If not, the system idles at function block 42 until wafers are present for processing. Once wafers are ready for processing in CVD process chamber 16, the oven 13 temperature is raised to 125° C. and stabilized, as indicated by function block 43. Then, the ATI is flowed through delivery line 23 to the IR cell 30 and, from there, via the valve in premix manifold assembly 26 to the exhaust line $21_3$, bypassing the process chamber 16 as indicated in function block 44. Based on the output of FTIR spectrometer 31, the process controller 17 determines in decision block 45 whether the concentration of the reactant gas is sufficiently pure. If it is, the valve in the premix manifold assembly 26 is operated to flow the ATI vapor to the CVD process chamber 16 in function block 46. The flow of ATI to the CVD process chamber 16 continues until processing of the wafers is completed, as determined in decision block 47. At that point, the valve in premix manifold assembly 26 is actuated, the oven 13 temperature is reduced to 90° C., as indicated in function block 48, and pump out of ATI via exhaust line $21_1$ is accomplished during idle.

Figure 3:
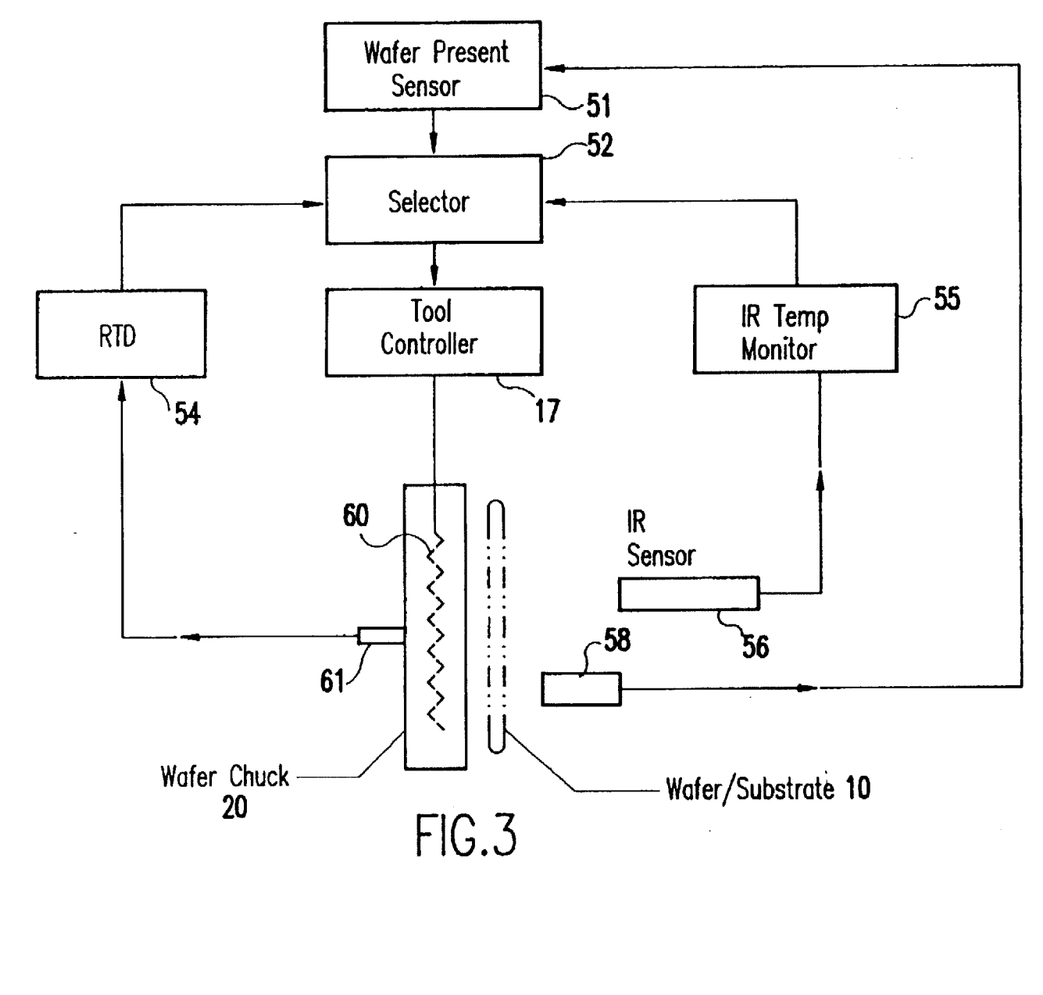
FIG. 3 is a functional block diagram of the infrared (IR) wafer temperature control system used in the low pressure chemical vapor deposition (LPCVD) system shown in FIG. 1.

Referring now to FIG. 3, wherein like reference numerals as used in FIG. 1 represent the same or similar components, there is shown the automatic IR wafer temperature control system according to one aspect of this invention. The IR temperature control system includes a wafer present sensor 58 which detects the presence of a wafer/substrate 10 on a wafer chuck 20 within an LPCVD reaction chamber. The sensor 58 communicates electrically with a wafer present sensor circuit 51, typically an amplifier and threshold circuit providing a predetermined output indicative of the presence of a wafer/substrate 10 within the reaction chamber. The output of the wafer present sensor circuit 51 is connected to a selector circuit 52 which is connected to process controller 17. The process controller 17 controls the heating of the wafer chuck 20 by means of the resistance heater 60. The selector circuit 52 has a connection to receive direct information from the IR temperature monitor circuit 55, which in turn is connected to an IR sensor 56. A third input line to the selector circuit 52 provides a connection to the resistance thermal device (RTD) signal conditioning circuit 54, which in turn is connected to resistance thermal device sensor 61 imbedded in the wafer chuck 20. The RTD circuit and device sensor are conventional in the prior art.

In operation, the temperature control portion of this invention works as follows. During idle time with no wafer/substrate 10 on the wafer chuck 20, the wafer present sensor 51 sends a signal to the selector 52 telling the process controller 17 to allow the RTD circuit 54 to control the wafer chuck temperature. When a wafer/substrate 10 is placed onto the wafer chuck 20, the wafer present sensor 51 then notifies the selector 52 to switch temperature control to the IR temperature monitor circuit 55. The IR temperature monitor circuit 55 is then used by the process controller 17 to adjust the temperature of the wafer chuck 20 to maintain the process temperature set point based on the actual wafer temperature. When the LPCVD process has been completed, the wafer/substrate 10 is removed from the wafer chuck 10 and control of the wafer chuck temperature is returned to the RTD circuit 54.

With reference again to FIG. 1, to establish pure chemical flow, the heated source 11 chemical (aluminum triisopropoxide or ATI) is delivered through the manifold 12 to the heated exhaust line $21_3$ via delivery line 23. The FTIR spectrometer 31 monitors the purity of the ATI vapor. Once the desired purity level has been established, the FTIR spectrometer 31 informs the process controller 17 that the ATI vapors can be redirected from the heated exhaust line $21_3$ to the process chamber 16.

The process controller 17 then polls the automated IR temperature monitor circuit 55 (see FIG. 3), and if the IR temperature monitor circuit 55 indicates the wafer/substrate temperature is within tolerance, the process controller 17 then switches the ATI flow from the heated exhaust line $21_3$ to the process chamber 16. If the wafer/substrate 10 is not at the prescribed temperature range, or if some portion of the temperature controlled delivery or exhaust system is not at the prescribed temperature the process controller 17 continues to poll the IR temperature monitor circuit 55, and the temperature controlled delivery and exhaust system until an acceptable signal is received or an alarm is generated.

In FIG. 4, where again like reference numerals designate like or similar components as shown in FIG. 1, the ATI source material is heated in oven 13 to obtain the required vapor pressure. Temperature monitoring sensor 15 feeds data to the process controller 17 (FIG. 1) which, in turn, maintains a correct source chemical temperature. The reactive vapor is then either contained in the pressure vessel 11 until it reaches the appropriate temperature, or the reactive vapor is allowed to flow to the vacuum pump 22 (shown in FIG. 1) through the temperature controlled exhaust line $21_3$ or to the CVD process chamber 16 through a separate temperature controlled line 29. At the end of the deposition step, the source is again isolated and inert gas passed through the vapor wetted lines, thus removing stagnant reactive vapor.

Figure 4:
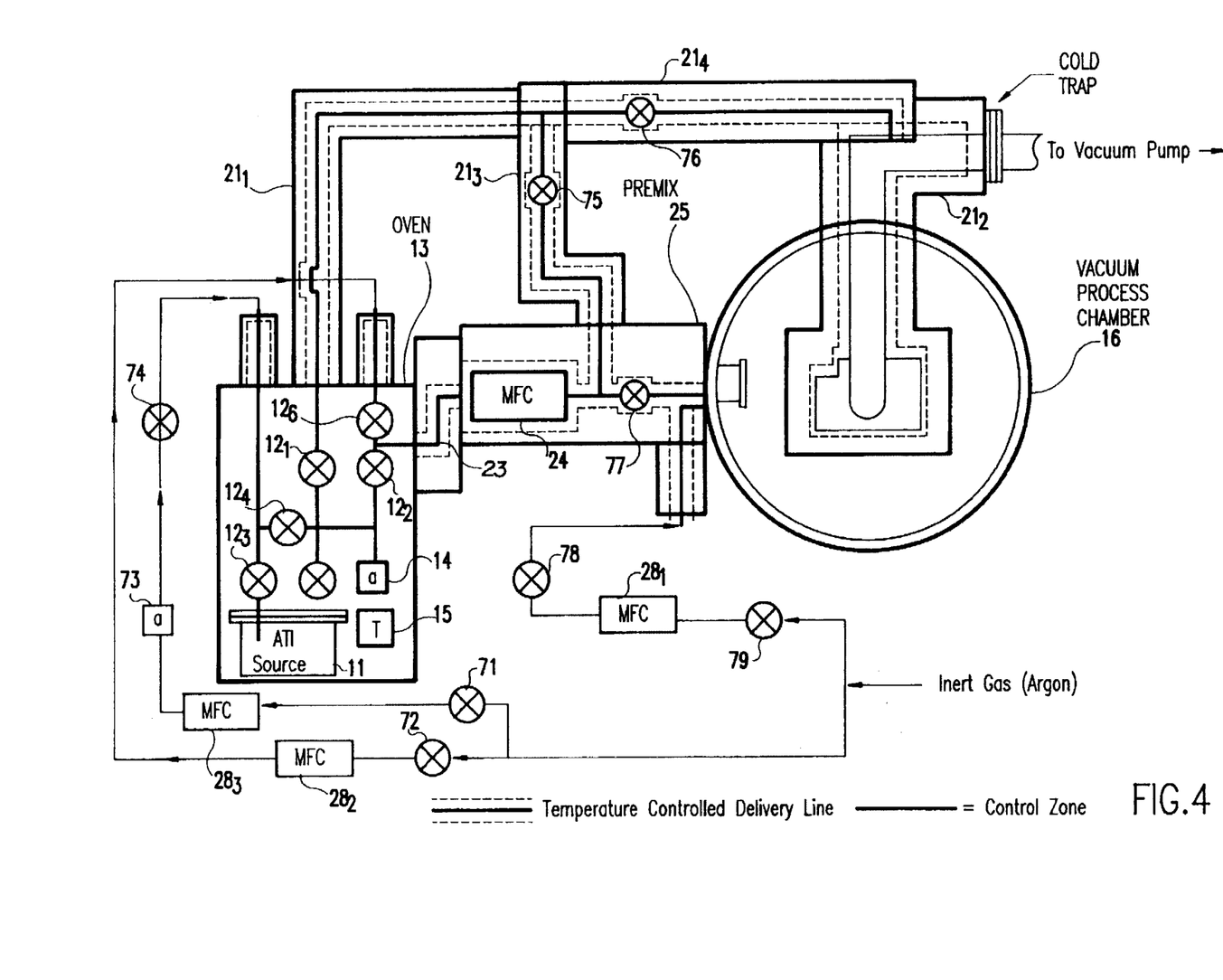
FIG. 4 is a block diagram of the LPCVD system shown in FIG. 1 illustrating in more detail the various components of the system for real time temperature control.

More particularly, the inert gas from source 27 (FIG. 1) is supplied to each of valves 71, 72 and 79. Valve 71 is connected via a mass flow controller 283 and a pressure sensor 73 to a valve 74. Valve 72 is connected to a mass flow controller $28_2$, and valve 79 is connected to mass flow controller $28_1$. The mass flow controllers $28_1$, $28_2$ and $28_3$ are represented schematically as the mass flow controller 28 shown in FIG. 1. The valve 74 and the mass flow controller $28_2$ are connected to the valves of the delivery manifold 12 within the oven 13. Specifically, valve 74 is connected to valves $12_3$ and $12_4$, and mass flow controller $28_2$ is connected to valve $12_6$. Valve $12_3$ is connected at an input of pressure vessel 11. Another valve $12_5$ is connected at an output of pressure vessel 11, and this valve $12_5$ is connected at a common juncture with valves $12_4$ and $12_1$. The pressure sensor 14 is connected to this common juncture and to valve $12_2$ which is also connected to valve $12_6$. The common juncture between valves $12_2$ and $12_6$ is connected to the delivery line $23_1$. In addition to these valves, a valve 78 is connected between the mass flow controller $28_1$ and the premix chamber 25. The valves 75 and 77 are part of the premix manifold assembly 26 (FIG. 1). Valve 76 is connected in exhaust line $21_4$.

In operation during nondeposition periods, the diluent gas, preferably argon, flows through all lengths of the supply and exhaust lines except for the pressure vessel 11 and is controlled by the valve system and mass flow controllers $28_2$ and $28_3$. Flow of diluent gas through the pressure vessel 11 is prevented by closing valves $12_3$ and $12_5$. With the use of a heated diluent gas flowing through the temperature controlled supply lines, all source chemical is purged from the lines and decomposition is prevented.

Upon initiation of source heat up prior to a deposition cycle the process controller 17 performs the following purge sequence to insure there is no film or scum across the ATI in source vessel 11. Valves 71, 74, $12_3$, $12_5$, $12_1$, and $21_4$ are opened. The pressure sensor 73 is connected to the process controller 17, and the mass flow controller $28_3$ is controlled by the process controller 17. Inert gas (such as argon) is allowed to flow thin this valve and vent arrangement to the vacuum pump 22 for a preset time to break apart any film or scum that has formed on the ATI melt within the source vessel 11.

When source delivery is required, the process controller 17 closes the appropriate valves, $12_3$, $12_4$, $12_1$, and $12_6$, and the source flow is initiated to the exhaust through the temperature controlled delivery lines to mass flow controller 24 and, via valves 75 and 76, to the exhaust lines $21_2$, $21_3$, and $21_4$ while also opening valve 78 to establish diluent flow through mass flow controller $28_1$ to the premix chamber 25. Once stable flow is established through mass flow controller 24, the FTIR spectrometer 31 (FIG. 1) indicates pure chemical flow and said substrate temperature sensor 55 (FIG. 3) indicates a substrate temperature within a prescribed process tolerance, valves 75 and 76 are closed and valve 77 is opened introducing the ATI vapor into the premix chamber 25, so as to mix the ATI vapor with the diluent gas. Once deposition is completed, the source supply is shut off at valve $12_5$. Valves 71, 72, 74, $12_4$, $12_1$ and $12_6$ are then opened. PDMFC 24 is also given a full open command from the process controller 17. This returns the diluent gas flow through the source delivery lines to the vent system and vacuum pumps, purging the delivery and vent lines of residual gases. Any residual source chemical carried through the delivery and vent lines is deposited in the cold trap at the end of the heated exhaust line $21_2$. This protects the down stream vacuum system from physical damage from the decomposed source chemical.

The control of the delivery line temperature is critical to long term repeatable operation of the system. All wetted surfaces of the delivery system must be at the same temperature as the prior section or at some slightly elevated temperature. A reduction in temperature from the prior section will initiate condensation of the source material. Conversely, if an incremental increase in the temperature gradient from section to section is too great, source decomposition or "plating out" is realized within the delivery line, again causing restriction and eventual clogs. In the preferred practice of the invention, a temperature gradient of +1° C. for each section is adequate to eliminate condensation and prevent decomposition plate out over a reasonable length of delivery line. The invention uses a zoned heating approach where individual sections of delivery lines are carefully heat taped, insulated, and independently temperature controlled and monitored.

Referring again to FIG. 4, each zone is outlined and has its own temperature controller and set point. With this technique, source delivery can be reliably obtained. For example, if the temperature of the heated oven 13 is selected to be 120° C., then the temperature of the heated source delivery system $23_1$ leading to the mass flow controller 24 should be 120+1° C. or 121° C. Likewise, the temperature of the exhaust line $21_1$ should be 121° C. The section of heated source delivery line $23_2$ which leads to the injector nozzle should be 122° C. The CVD process chamber and exhaust line $21_3$, like the heated source delivery line $23_2$, should also be 122° C. Finally, the temperature of the exhaust line $21_2$ to the vacuum pump should be 123° C.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An apparatus for depositing dense aluminum oxide on a substrate, said apparatus being divided into temperature controlled zones and comprising:

a) a pressure vessel containing aluminum tri-isopropoxide source material from which a source chemical vapor is produced;

b) a delivery manifold connected to said pressure vessel and having first and second outputs, said delivery manifold selectively delivering said source chemical vapor to one of the first output and the second output;

c) an isothermal oven containing said pressure vessel and said delivery manifold for heating the same;

d) means for monitoring pressure and temperature within said pressure vessel;

e) a chemical vapor deposition (CVD) process chamber having at least one gas injector nozzle for injection of gas into the chamber, said CVD process chamber having a wafer chuck and a resistance thermal device (RTD) built into said wafer chuck for heating the wafer chuck and providing an output signal representative of wafer chuck temperature;

f) a temperature sensor positioned proximate the wafer chuck for providing an output signal representative of a temperature of a wafer positioned upon the wafer chuck;

g) an insulated and temperature controlled exhaust line connected to the first output of said delivery manifold and further being connected to said chemical vapor deposition chamber for providing a temperature controlled exhaust from said delivery manifold and the chemical vapor deposition chamber;

h) a temperature controlled delivery line having first and second ends thereof, said temperature controlled delivery line being connected at the first end thereof to the second output of said delivery manifold, said temperature controlled delivery line having a cross section sufficient to provide a required mass flow of said source chemical vapor for a deposition rate of aluminum oxide on a substrate;

i) a temperature controlled pressure differential mass flow controller connected to the second end of said temperature controlled delivery line for providing accurate flow of said source chemical vapor through said temperature controlled delivery line;

j) a premix chamber including a heated and insulated valve premix manifold assembly connected to said pressure differential mass flow controller, said premix manifold assembly having first and second outputs, the first output of said premix manifold assembly comprising a chamber for allowing said source chemical vapor to be mixed with a mass flow controlled, preheated inert gas, the first output of said premix manifold assembly further being connected to the gas injector of the chemical vapor deposition chamber for injection of the mixed source chemical vapor and inert gas therein, the second output of said premix manifold assembly being connected to the exhaust line; and k) a process controller connected to said delivery manifold, said heating device, said process vessel monitoring means, said exhaust line, said temperature controlled delivery line, said pressure differential mass flow controller, said CVD process chamber walls and said premix manifold assembly for controlling the pressure and the temperature of source chemical vapor being delivered throughout the same to be within a temperature range and a pressure range thereby minimizing at least one of potential condensation and decomposition of the source chemical vapor during delivery.

2. The apparatus recited in claim 1 wherein the process controller controls the temperature of the isothermal oven to maintain the temperature of the source chemical vapor to not greater than 125° C.

3. The apparatus recited in claim 2 wherein said temperature controlled zones are successively positioned between the isothermal oven and the CVD process chamber, and wherein the process controller controls the temperature of each succeeding zone of said temperature controlled zones from the isothermal oven to the CVD process chamber to +1° C. greater than a preceding zone of said temperature controlled zones.

4. The apparatus recited in claim 1 wherein said process controller is further connected to receive outputs from the resistance thermal device and the infrared temperature sensor and controlling the wafer chuck temperature to maintain a process temperature set point based on an actual wafer temperature, said process controller further controlling the delivery of the source chemical vapor from said pressure vessel to said exhaust line, said delivery line, said premix manifold assembly, and the CVD process chamber according to prescribed deposition process parameters.

5. The apparatus of claim 4 wherein said temperature sensor for providing an output signal representative of a temperature of a wafer positioned upon the wafer chuck is an infrared (IR) sensor.

6. The apparatus recited in claim 1, wherein:

said temperature sensor comprises an infrared temperature sensor and said processor controller being further connected to receive outputs from the resistance thermal device and the infrared temperature sensor and controlling the wafer chuck temperature to maintain a process temperature set point based on an actual wafer temperature.

7. The apparatus recited in claim 6 further comprising:

a wafer presence switch for providing a signal indicative of the presence or absence of a wafer on the wafer chuck; and a selector connected to the wafer presence switch for selecting either the output signal from said resistance thermal device or the output signal from said infrared temperature sensor in response to the absence or presence, respectively, of a wafer on the wafer chuck as indicated by the signal of said wafer presence switch.

8. The apparatus recited in claim 1, further comprising:

an Fourier transfer infrared (FTIR) spectrometer source chemical control unit connected to said pressure vessel said exhaust line and said temperature controlled delivery line leading as output from said pressure vessel alternatively to a vacuum pump or to said process chamber, said wafer chuck within said process chamber being supported by a high temperature turret mechanism, said apparatus further comprising a wafer gripper used to transfer said wafer to said wafer chuck, said gas injector nozzle being at an opening of said process chamber, said process chamber having an exit connecting said process chamber by said exhaust line to said vacuum pump, and said temperature sensor including an infrared (IR) temperature sensor monitoring the wafer temperature within said process chamber and sending data to said process controller.

9. The apparatus recited in claim 6, wherein:

said process chamber includes temperature controlled walls and a loading door, said apparatus further comprising means for gripping said wafer at the process chamber loading door and transferring the wafer to said wafer chuck within said process chamber, said source chemical vapor comprising ATI vapor, said premix chamber further including valving means for selectively delivering ATI vapor to either the mixing chamber via said gas injector nozzle or to the exhaust line, said apparatus further comprising a Fourier transform infrared (FTIR) spectrometer source chemical control unit for monitoring purity characteristics of the ATI vapor as the vapor is delivered to said premix chamber and further providing an indication of either pure or impure chemical flow, said process controller further for controlling said ATI delivering means to selectively deliver ATI vapor to the heated exhaust line when said FTIR unit indicates impure chemical flow or to selectively deliver ATI vapor to the process chamber when said FTIR unit indicates pure chemical flow and said temperature sensor indicates a wafer temperature within a prescribed process tolerance, whereby flow of pure ATI vapor into the process chamber reacts on the wafer surface to form an aluminum oxide film thereon.

10. An apparatus as recited in claim 1, further comprising:

a temperature monitoring device proximate said pressure vessel for monitoring temperature of said source material within said pressure vessel;

a pressure gauge within said isothermal oven attached to and monitoring pressure within said exhaust line and said temperature controlled delivery line leading from said pressure vessel to a exit of said isothermal oven;

wherein said temperature controlled delivery line and said exhaust line respectively lead from said exit of said isothermal oven to a vacuum pump and said process chamber; and said exhaust line and said temperature controlled delivery line including valves for directing flow of said source material to either said vacuum pump or said process chamber.

* * * * *

UNITED STATES PATENT AND TRADEMARK OFFICE
CERTIFICATE OF CORRECTION

| | | |
|---|---|---|
| PATENT NO. | : 5,728,222 | Page 1 of 1 |
| APPLICATION NO. | : 08/541278 | |
| DATED | : March 17, 1998 | |
| INVENTOR(S) | : Steven George Barbee et al. | |

It is certified that error appears in the above-identified patent and that said Letters Patent is hereby corrected as shown below:

On title page of Patent under item "Notice:", replace:

"The term of this patent shall not extend beyond the expiration date of Pat. No. 5,505,664."

with

"The term of this patent shall not extend beyond the expiration date of Pat. No. 5,648,113."

Signed and Sealed this
Third Day of June, 2014

Michelle K. Lee
*Deputy Director of the United States Patent and Trademark Office*